(12) United States Patent
Choi et al.

(10) Patent No.: US 7,511,358 B2
(45) Date of Patent: Mar. 31, 2009

(54) NONVOLATILE MEMORY DEVICE HAVING MULTI-BIT STORAGE AND METHOD OF MANUFACTURING THE SAME

(75) Inventors: Byung-yong Choi, Suwon-si (KR); Choong-ho Lee, Seongnam-si (KR); Dong-gun Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 16 days.

(21) Appl. No.: 11/517,595

(22) Filed: Sep. 7, 2006

(65) Prior Publication Data

US 2007/0054448 A1 Mar. 8, 2007

(30) Foreign Application Priority Data

Sep. 8, 2005 (KR) .................. 10-2005-0083582

(51) Int. Cl.
*H01L 29/06* (2006.01)
(52) U.S. Cl. .............. 257/618; 257/324; 257/353; 257/E29.17
(58) Field of Classification Search ............ 257/288, 257/324, 347, 353, 618, E29.17
See application file for complete search history.

(56) References Cited

U.S. PATENT DOCUMENTS

| 6,903,967 B2 * | 6/2005 | Mathew et al. ........... 365/177 |
| 6,906,398 B2 * | 6/2005 | Yeo et al. ................ 257/500 |
| 2004/0183126 A1 * | 9/2004 | Bae et al. ................ 257/324 |
| 2004/0197995 A1 * | 10/2004 | Lee et al. ................ 438/257 |
| 2006/0097310 A1 * | 5/2006 | Kim et al. ............... 257/321 |

FOREIGN PATENT DOCUMENTS

| JP | 405145080 A | * | 6/1993 | .......... 257/326 |
| JP | 2003-078048 | | 3/2003 | |
| KR | 10-0474850 | | 3/2005 | |

* cited by examiner

*Primary Examiner*—A. Sefer
*Assistant Examiner*—Eduardo A Rodela
(74) *Attorney, Agent, or Firm*—Mills & ONello LLP

(57) ABSTRACT

Provided are a nonvolatile memory device having multi bit storage and a method of manufacturing the same. The method includes forming a tunneling dielectric layer, a charge storage layer and a charge blocking layer on a fin-active region, forming sacrificial patterns having a groove to open a crossing region of the active region on the charge blocking layer, selectively removing portions of the charge blocking layer, the charge storage layer and the tunneling dielectric layer exposed by the opening groove using the sacrificial layer patterns as an etch mask to expose a top surface and side surfaces of the active region, forming a gate dielectric layer on exposed portion of the active region to cover exposed side surfaces of the of charge storage layer, forming a first gate on the gate dielectric layer to fill the groove, removing the sacrificial layer patterns, forming second gates on side surfaces of the first gate, forming isolated local charge storage patterns, charge blocking patterns and tunneling dielectric patterns by selectively removing exposed portions of the charge blocking layer, the charge storage layer and the tunneling dielectric layer, and forming a source/drain region on the active region.

10 Claims, 12 Drawing Sheets

NONVOLATILE MEMORY DEVICE HAVING MULTI-BIT STORAGE AND METHOD OF MANUFACTURING THE SAME

CROSS-REFERENCE TO RELATED PATENT APPLICATION

This application claims the benefit of Korean Patent Application No. 10-2005-0083582, filed on Sep. 8, 2005, in the Korean Intellectual Property Office, the contents of which are incorporated herein in their entirety by reference.

BACKGROUND OF THE INVENTION

1. Field of the Invention

The present invention relates to a memory device, and more particularly, to a nonvolatile memory device having multi-bit storage and a method of manufacturing the same.

2. Description of the Related Art

There is great demand for increasing memory density of nonvolatile memory devices and flash memory devices. Memory density increases by reducing the size of a memory cell or by allowing the memory device to store a greater number of states, i.e., multi-bit.

Research is being conducted into the implementation of a memory transistor capable of storing multiple bits in a single memory transistor. For example, a silicon-oxide-nitride-oxide-silicon (SONOS) transistor was introduced to implement a 2-bit operation of a memory device. The SONOS includes a silicon nitride layer as a charge storage layer between a gate and a semiconductor substrate. The 2-bit operation of the transistor can be achieved through a forward reading and a reverse reading of a threshold voltage $V_{th}$ because the SONOS transistor stores charges in different locations.

As the integrity of nonvolatile memory devices increases, a line width of the charge storage layer and a channel width becomes narrow. Therefore, it is important to secure a wider valid channel width in nonvolatile memory devices. Also, the reduction of the channel width causes a short channel effect. In order to overcome this drawback, a method of securing a wider valid channel width is required.

The reduction of the channel width may also cause a cross-talking problem. That is, charge distributions stored in a charge storage layer are overlapped due to a narrow line width of the charge storage layer. For example, tail portions of charge distributions stored in both end regions of a charge storage layer may be overlapped. Accordingly, independent signals may interfere with each other and operations of the memory device cannot be distinguished. That is, interference between signals degrades the memory device's capability to store multiple bits.

Therefore, there is a demand to develop a memory device capable of independently storing charges in a charge storage layer in order to allow a nonvolatile memory device to perform a multi-bit operation or to store multiple bits.

SUMMARY OF THE INVENTION

The present invention provides a nonvolatile memory device independently storing multiple bits and securing a valid channel width of a transistor, and a method of manufacturing the same According to an aspect of the present invention, there is provided a nonvolatile memory device which includes: a fin type active region formed on a semiconductor substrate; a gate formed on the fin type active region; and a pair of local charge storage layer patterns formed under the gate, which are physically isolated from each other by an extending portion of the gate.

The nonvolatile memory device may further include: a charge blocking layer interposed between the local charge storage patterns and the gate; a tunneling dielectric layer interposed between the local charge storage layer patterns and the active region for charge tunneling; and a gate dielectric layer extending between a side surface of the local charge storage layer pattern and the gate by being formed between the active region and the extending portion of the gate.

The gate may include: a first gate aligned on the portion of the active region between the two physically isolated local charge storage patterns; and two second gates each of which is aligned on each of the two physically isolated local charge storage patterns, respectively.

The second gates may be formed on side surfaces of the first gate in a spacer shape so as to have the same line width.

The gate dielectric layer may be further extended between the first gate and the second gates.

The gate dielectric layer may be further extended between the charge blocking layer and the gate.

The charge storage layer may include a silicon nitride material layer that stores charge, and each of the charge blocking layer and the tunneling dielectric layer includes a silicon oxide material layer so as to form a stack structure of oxide-nitride-oxide.

According to another aspect of the present invention, there is provided a method of fabricating a nonvolatile memory device including: forming a fin type active region on a semiconductor substrate; forming a tunneling dielectric layer, a charge storage layer and a charge blocking layer in sequence to cover the active region; forming sacrificial layer patterns on the charge blocking layer having an opening groove that opens a crossing region of the active region; selectively removing exposed portion of the charge blocking layer, the charge storage layer and the tunneling dielectric layer through the opening groove using the sacrificial layer patterns as an etch mask to expose a top surface and side surfaces of the active region; forming a gate dielectric layer on the exposed portion of the active region to cover the exposed side surfaces of the charge storage layer; forming a first gate on the gate dielectric layer to fill the opening groove; removing the sacrificial layer patterns, selectively; forming second gates each having a spacer shape on the side surfaces of the first gate on the exposed portion of the charge blocking layer; forming a pair of local charge storage layer patterns, the charge blocking layer patterns and the tunneling dielectric layer patterns, widths of which are defined by the second gates and which are physically isolated by the first gate and the gate dielectric layer, by selectively removing an externally exposed portion of the charge blocking layer and portions of the charge storage layer and the tunneling dielectric layer under the exposed portion of the charge blocking layer using the second gates and the first gates as the etch masks; and forming a source region and a drain region in portions of the active region each of which externally is exposed from a side surface of the second gates.

The charge storage layer may be formed to have a silicon nitride layer, and each of the charge blocking layer and the tunneling dielectric layer is formed to have a silicon oxide material layer so as to form a structure of oxide-nitride-oxide. The charge storage layer may be formed to have a conductive poly silicon layer that stores a charge.

The sacrificial layer patterns may include an insulating material having an etch selectivity different from the first gate. The sacrificial layer patterns may include at least one of silicon oxide and silicon nitride.

The forming of the first gate may include: forming a conductive layer filling the opening groove; and etching back the conductive layer to expose the surface of the sacrificial layer pattern. The gate dielectric layer may be extended to cover an inner side surface of the sacrificial layer patterns that cover the side surfaces of the first gate.

Forming the second gates may include: forming a conductive layer to cover the side surface of the first gate; and forming a spacer shaped conductive layer on side surfaces of the first gate and defining the two gates by anisotropically etching the conductive layer, wherein each of the local charge storage layer patterns is formed to have the same width by being aligned on the second gates, respectively.

According to another aspect, the invention is directed to a method of fabricating a nonvolatile memory device including: forming a fin type active region on a semiconductor substrate; forming a tunneling dielectric layer, a charge storage layer and a charge blocking layer in sequence to cover the active region; forming sacrificial layer patterns having a first opening groove to open a crossing region of the active region, on the charge blocking layer; forming first gates on inner side surfaces of the sacrificial layer patterns in a spacer shape so as to form a second opening groove having a narrower width than the first opening groove; selectively removing exposed portions of the charge blocking layer, the charge storage layer and the tunneling dielectric layer using the sacrificial layer patterns and the first gates as an etch mask to expose a top surface of the active region and side surfaces of the charge blocking layer, the charge storage layer and the tunneling dielectric layer; forming a gate dielectric layer to cover exposed side surfaces of the charge storage layer on the exposed portions of the active region; forming a second gate on the gate dielectric layer to fill the second opening groove; removing the sacrificial layer patterns selectively; forming a pair of local charge storage layer patterns, the charge blocking layer patterns and the tunneling dielectric layer patterns, which are aligned along the first gate and physically isolated by the second gate and the gate dielectric layer, by selectively removing a portion of the charge blocking layer exposed by removing the sacrificial layer pattern and portions of the charge storage layer and the tunneling dielectric layer under the exposed portion of the charge blocking layer using the first and the second gates as an etch mask; and forming a source region and a drain region in externally exposed side portions of the active region.

The gate dielectric layer may be extended to cover the side surfaces of the first gates.

The forming of the first gates may include: forming a conductive layer to cover side portions of the sacrificial layer patterns; and forming a spacer shaped conductive layer on the side portions of the sacrificial layer patterns by anisotropically etching the conductive layer, wherein each of the local charge storage patterns are formed to be aligned along a corresponding one of the first gates.

According to another aspect, the present invention is directed to a method of fabricating a nonvolatile memory device including: forming a fin type active region on a semiconductor substrate; forming a tunneling dielectric layer, a charge storage layer and a charge blocking layer in sequence to cover the active region; forming first sacrificial layer patterns having a first opening groove that opens a crossing region of the active region on the charge blocking layer; forming second sacrificial layer patterns on inner side surfaces of the first sacrificial layer patterns in a spacer shape so as to form a second opening groove having a narrower width than the first opening groove; selectively removing a portion of the charge blocking layer exposed by the second opening groove, and portions of the charge storage layer and the tunneling dielectric layer under the exposed portion of the charge blocking layer using the first and the second sacrificial layer patterns as an etch mask to expose a top surface of the active region and side surfaces of the charge blocking layer, the charge storage layer and the tunneling dielectric layer; removing the second sacrificial layer pattern selectively; forming a gate dielectric layer to cover exposed side portions of the charge storage layer on the exposed portion of the active region; forming a gate on the gate dielectric layer and a remaining portion of the charge blocking layer exposed by the removal of the second sacrificial layer patterns to fill the first opening groove; removing the first sacrificial layer pattern, selectively; forming a pair of local charge storage layer patterns, charge blocking layer patterns and tunneling dielectric layer patterns, which are aligned along an external outline of the gate and physically isolated from each other by selectively removing an exposed and remaining portion of the charge blocking layer, and portions of the charge storage layer and the tunneling dielectric layer under the exposed portion of the charge blocking layer using the gate as an etch mask; and forming a source region and a drain region on exposed side portions of the gate in the active region.

The first and the second sacrificial layer patterns may be formed of different insulating materials having different etch selectivities.

The formation of the second sacrificial layer patterns may include: forming an insulating layer to cover side portions of the first sacrificial layer patterns; and forming a spacer shaped insulating layer on side portion of the first sacrificial layer patterns by anisotropically etching the insulating layer, wherein the local charge storage layer patterns are formed to be aligned along the first sacrificial layer patterns.

According to the present invention a wider valid channel width of a transistor of a nonvolatile memory device may be secured by adopting a structure of a fin type transistor (FinFET). Also, physically isolated local storage layer patterns may be embodied to impudently store charge distributions for preventing the stored charge distributions from being overlapped. Therefore, a nonvolatile memory device capable of storing a multi-bit and a method of fabricating the same are provided.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

In some embodiments of the present invention, a nonvolatile memory device is embodied by adopting a fin FET transistor (FinFET) structure. Accordingly, a wider valid channel width of a transistor may be secured. Therefore, a short channel effect caused by reduction in size of a memory device may be eliminated, and current characteristics thereof may be improved. Hence, it is possible to embody a short transistor having a wider channel width and to improve the integrity of the memory device.

In some other embodiments of the present invention, local charge storage layer patterns, which are physically isolated from one another, may be embodied by locally disposing an electron storage layer under a gate.

In some other embodiments of the present invention, a gate electrode may be formed in a sidewall spacer shape through an inner sidewall process or an outer sidewall process in order to improve a gate controllability that influences a program charge density. The local charge storage layer patterns may be symmetrically formed to be arranged at the sidewall spacer type gate electrode. Therefore, line widths of the local charge storage layer patterns may be uniformly formed.

Since local charge trapping patterns are formed to be physically isolated from each other, a nonvolatile memory device e same can perform a 2-bit operation. The cross-talking defect caused by overlapped tail portions of stored charge distribution is prevented by storing charge in the isolated charge storage layer patterns. Therefore, it is possible to stably perform a forward read/write operation and a reserve read/write operation.

Figure 1A:
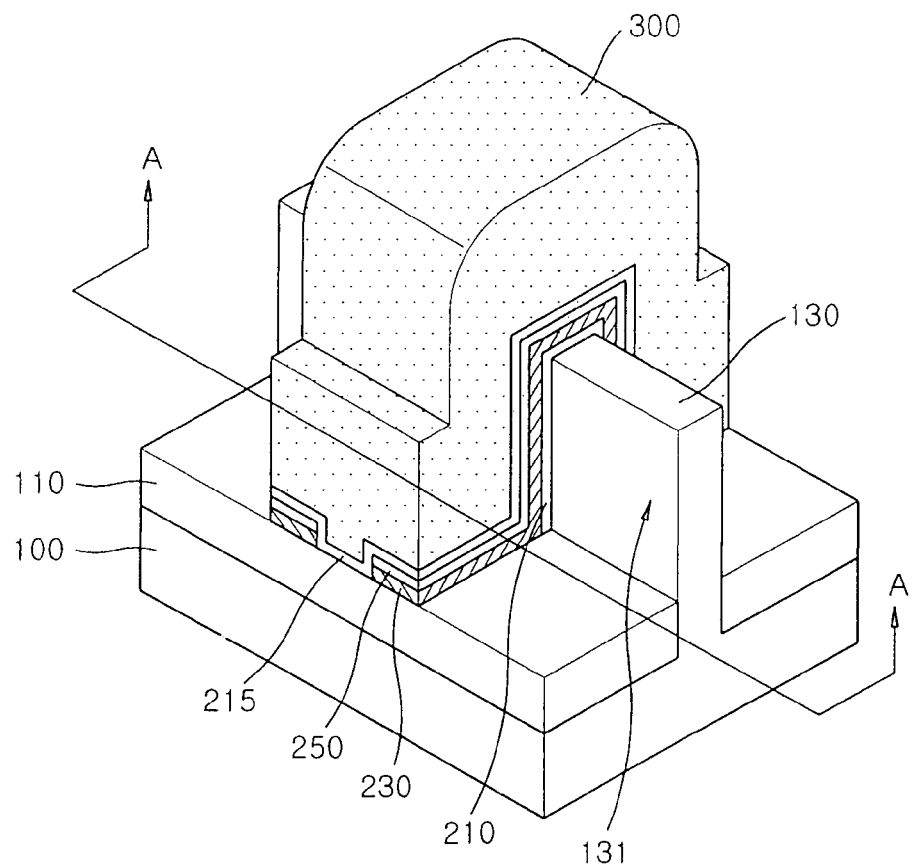
FIG. 1A is a schematic perspective view of a nonvolatile memory device according to an embodiment of the present invention.
Figure 1B:
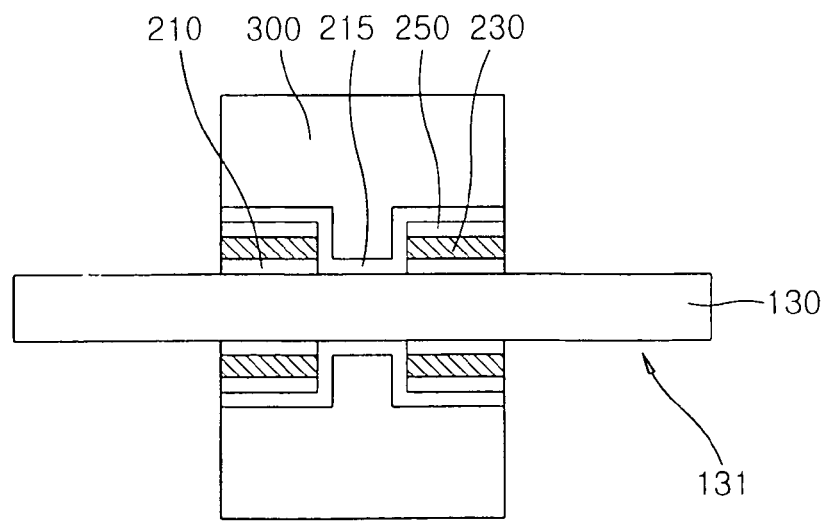
FIG. 1B is a cross-sectional view of the memory device of FIG. 1A taken along line A-A'.

FIG. 1A is a schematic perspective view of a non volatile memory device according to an embodiment of the present invention. FIG. 1B is a cross-sectional view of FIG. 1A along a line A-A'. FIGS. 2 through 11 are perspective views for describing a method of fabricating a nonvolatile memory device according to an embodiment of the present invention.

Referring to FIGS. 1A and 1B, the nonvolatile memory device may include an active region 130 projecting from a substrate 100 in a shape of a bar or a fin, and a gate 300 formed on the active region 130 to cross the active region 130.

A first gate dielectric layer 215 is interposed between the gate 300 and the active region 130, and two local charge storage layer patterns 230 that are physically isolated by the first gate dielectric layer 215 and the gate 300 may be disposed at both sides under the gate 300. The two local charge storage layer patterns 230 may be formed symmetrically. A tunneling dielectric layer 210 may be disposed between the two local charge storage layer patterns 230 and the active region 130 for electron tunneling. A charge blocking layer 250 may be interposed between the local charge storage layer patterns 230 and the gate 300 to block back tunneling.

The fin shaped active region 130 may be projected from the substrate 100 to have a mesa shape. Therefore, the gate 300 and the charge storage layer patterns 230 may be formed to cross the active region 130 and to cover an upper surface and side surfaces of the active region 130.

In the nonvolatile memory device illustrated in FIG. 1A, a silicon semiconductor substrate is used as the substrate 100. The active region 130 may be formed to be connected to the substrate 100 and to be isolated by the device isolation region 110. However, a silicon on insulator (SOI) substrate may be used as the substrate 100. In this case, an insulating layer may extend under the active region 130 to form a device isolation layer.

The first gate dielectric layer 215 may be extended to cover side surfaces of the charge storage layer patterns 230. The charge blocking layer 250 may be extended on a top surface of the charge storage layer patterns 230. Accordingly, bottom surfaces of the charge storage layer patterns 230 may be isolated by the tunneling dielectric layer 210, the side surfaces of the charge storage layer patterns 230 may be isolated by the extending portion of the first gate dielectric layer 215 and the upper surfaces of the charge storage layer patterns 230 may be isolated by the charge blocking layer 250. An insulating spacer (not shown) may be further formed on an outer surface of the gate 300 to isolate the gate 300 and/or side surfaces of the charge storage layer patterns 230.

A source/drain region 131 may be formed in an exposed portion of the active region 130 using a doping process such as an impurity ion implantation process.

As described above, a pair of charge storage layer patterns 230, which may be symmetrically and physically isolated, may be patterned using a damascene scheme while patterning the gate 300.

Figure 2:
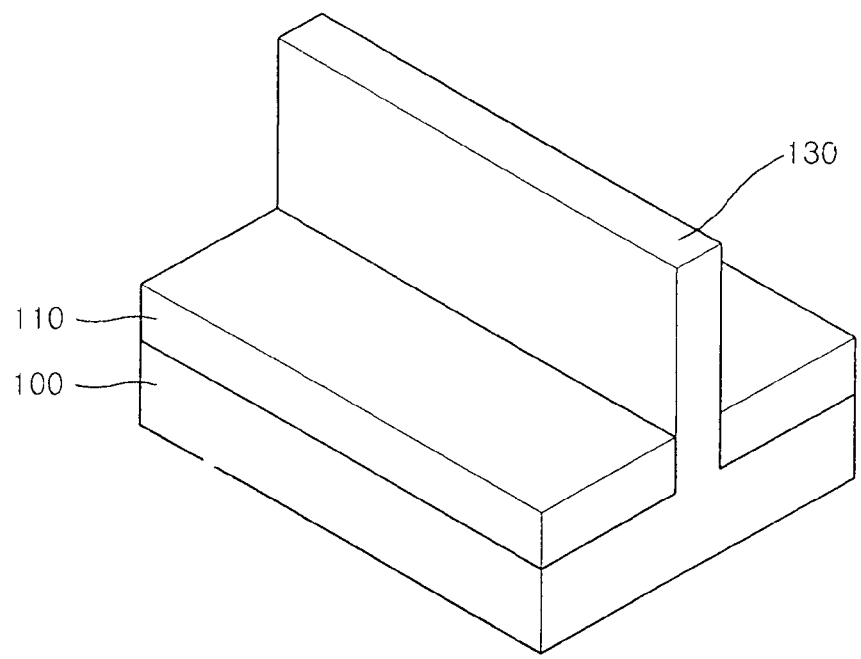
FIGS. 2 through 11 are schematic perspective views illustrating a method of fabricating a nonvolatile memory device according to an embodiment of the present invention.

Referring to FIG. 2, a fin shaped active region 130 may be formed on a substrate 100. The active region 130 may be projected from the substrate 100 and may be formed to have an exposed upper surface and exposed side surfaces.

The fin shaped active region 130 may be formed using various methods. For example, if a silicon semiconductor substrate is used as the substrate 100, a device isolation region 110 is formed on the substrate 100 by forming a trench and filling the trench with an insulating layer using a shallow trench isolation (STI) process. The active region 130 may become projected by recessing the insulating layer to form the device isolation region 110 using an etch back process. If an SOI substrate is used as the substrate 100, the active region 130 is formed to have a fin shape by patterning a silicon layer of the SOI substrate.

Figure 3:
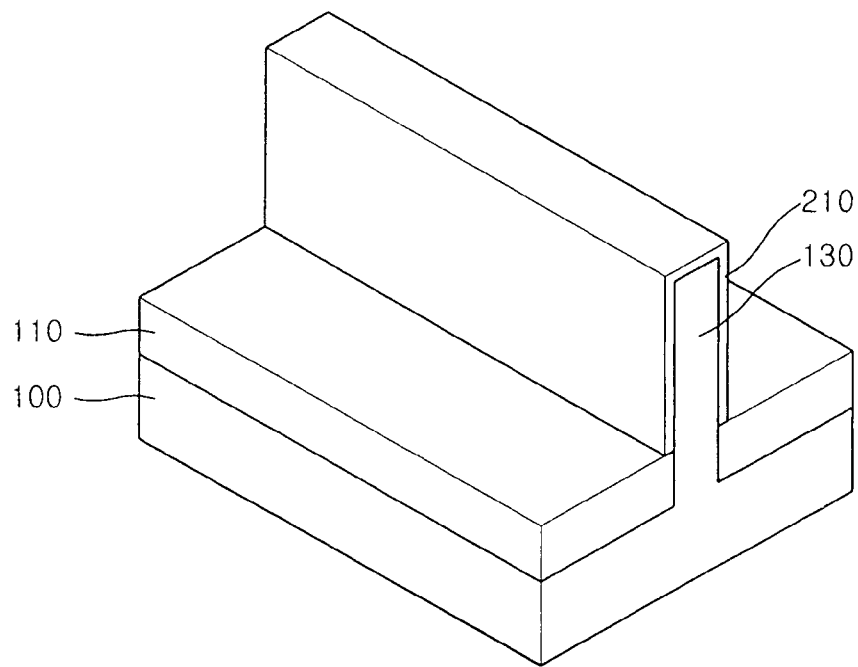

Referring to FIG. 3, a tunneling dielectric layer 210 may be formed to cover the active region 130. The tunneling dielectric layer 210 may be a dielectric layer for charge tunneling, especially, electron tunneling. For example, the tunneling dielectric layer 210 may be formed to include a silicon oxide layer by oxidizing a surface of the active region 130 which may be formed of silicon. Alternatively, the tunneling dielectric layer 130 maybe formed by depositing silicon oxide.

Figure 4:
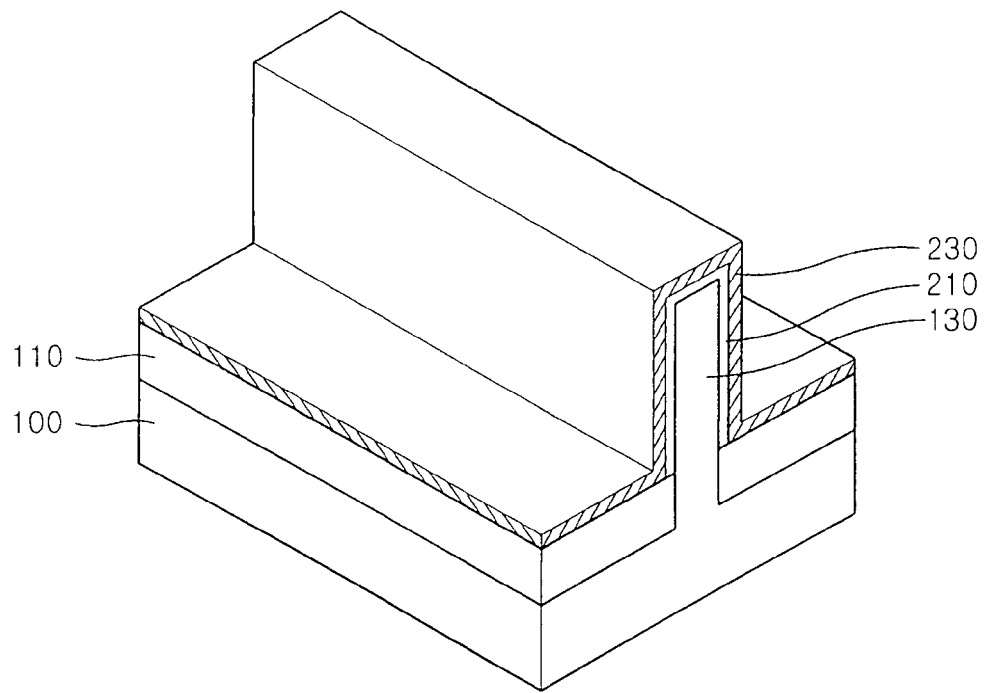

Referring to FIG. 4, a charge storage layer 230 may be formed on the tunneling dielectric layer 210. The charge storage layer 230 may be formed of a material including a silicon nitride layer, which can store electrons injected through tunneling. The silicon nitride layer may be formed as the charge storage layer 230 to build an Oxide-Nitride-Oxide (ONO) structure. Also, a conductive poly silicon layer may be formed as the charge storage layer 230 to build an Oxide-Silicon-Oxide (OSO) structure. The charge storage layer 230 may be formed of a material that can store charge, such as silicon dots, a SiGe layer, or a nano crystal arranged layer.

Figure 5:
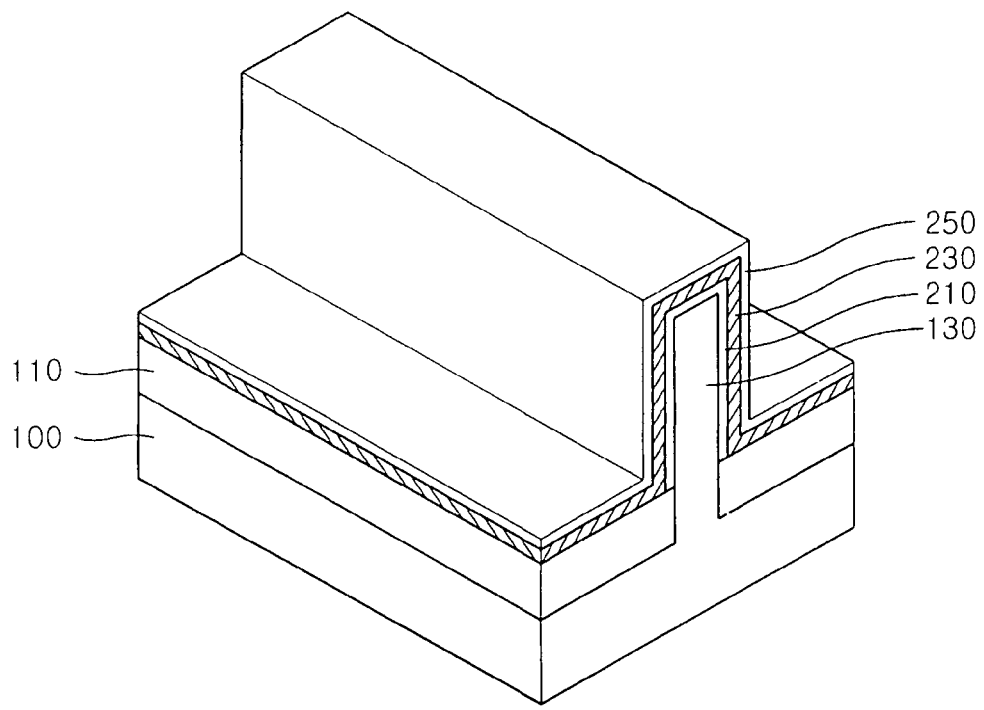

Referring to FIG. 5, a charge blocking layer 250 may be formed on the charge storage layer 230 to block back-tunneling during an erase operation of the nonvolatile memory device. For example, the charge blocking layer 250 may be formed of silicon oxide.

Figure 6:
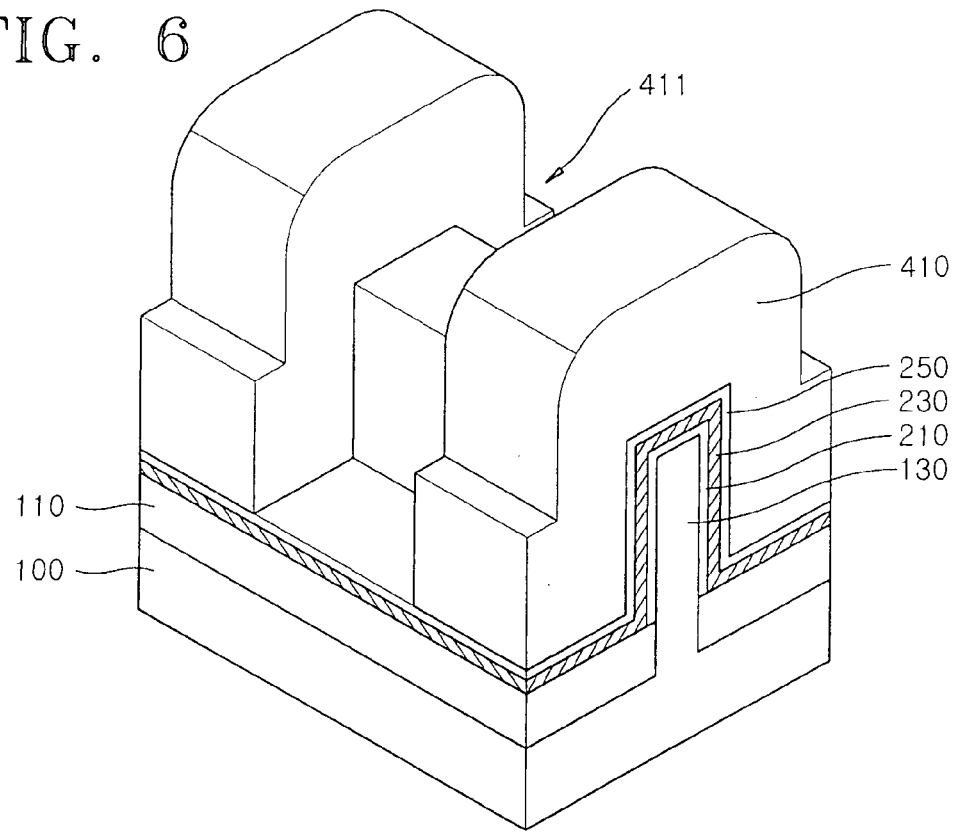

Referring to FIG. 6, a first sacrificial layer 410 is formed on the charge blocking layer 250 as a frame for patterning a gate into a word line. That is, the first sacrificial layer 410 is formed on the stacked structure formed of the tunneling dielectric layer 210, the charge storage layer 230 and the charge blocking layer 250. The first sacrificial layer 410 may be a damascene pattern for gate patterning and the first sacrificial layer 410 may be removed after the gate patterning. Accordingly, the first sacrificial layer pattern 410 may be formed of an insulating material, i.e., a silicon nitride layer or a silicon oxide layer, which can be easily removed.

Since the first sacrificial layer pattern 410 is formed to define the gate 300 as illustrated in FIG. 1A, the first sacrificial layer pattern 410 is patterned to have a first opening groove 411 for the gate pattern. The first opening groove 411 may be formed to have the substantially equivalent width to that of the gate 300. Since the first opening groove 411 is formed at a location where the gate 300 is formed, the first opening groove 411 crosses the active region 130 and the charge blocking layer 250 is partially exposed by the first opening groove 411 as illustrated in FIG. 6. Also, the first sacrificial layer pattern 410 may be formed to cover a portion (131 of FIG. 1A) of a source and a drain region.

Figure 7:
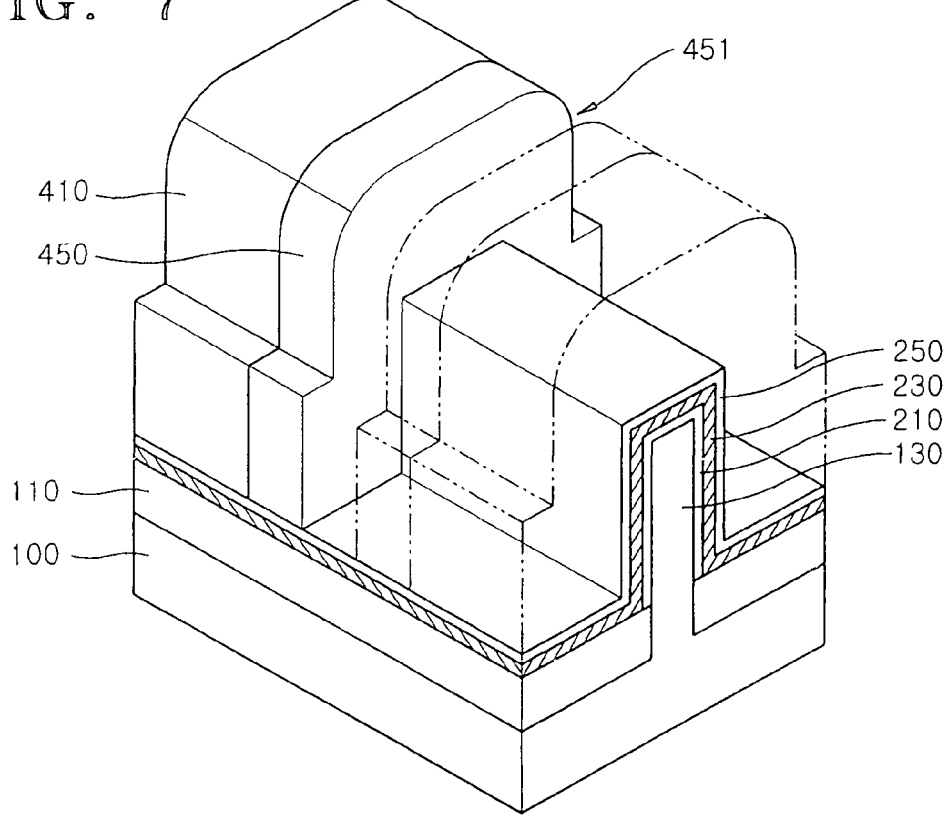

Referring to FIG. 7, after forming the first sacrificial pattern 410, second sacrificial layer patterns 450 may be formed in a spacer shape on inner side surfaces of the first opening groove 411. The second sacrificial patterns 450 may be formed of an insulating material having a different etch selectivity compared to the first sacrificial layer pattern 410. For example, if the first sacrificial layer pattern 410 is formed of silicon oxide, the second sacrificial layer pattern 450 may be formed of silicon nitride which has a different etch selectivity compared to the silicon oxide.

The second sacrificial layer patterns 450 are formed to cover the first sacrificial layer pattern 410 and the exposed charge blocking layer 250. The second sacrificial layer patterns 450 are formed using an anisotropic etch process including etch back process. Therefore, the second sacrificial layer patterns 450 are formed on the inner side surfaces of the first sacrificial layer patterns 410 to face each other.

The second sacrificial layer patterns 450, which are formed in a spacer shape to face each other using anisotropic etch process, have equivalent line widths without additionally controlling the width.

Since the second sacrificial layer patterns 450 are formed on the inner side surfaces of the first opening groove 411, a second opening groove 451 has a narrower line width. The second opening groove 451 partially exposes the charge blocking layer 250.

Figure 8:
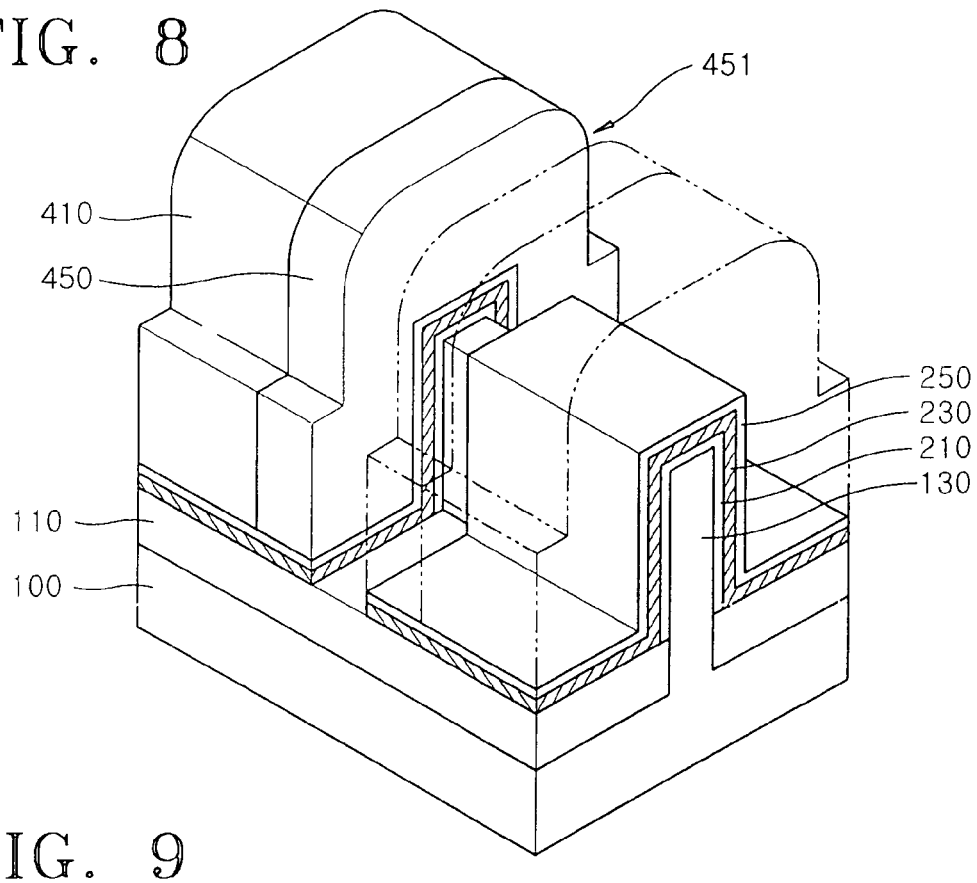

Referring to FIG. 8, the exposed portion of the charge blocking layer 250 may be selectively etched using the first and the second sacrificial pattern layers 410 and 450 as a mask. Then, portions of the charge blocking layer 250 and the tunneling dielectric layer 210 under the exposed portion of the charge block layer 240 may be selective etched, continuously. As a result, the stacked structure of the tunneling dielectric layer 210, the charge storage layer 230 and the charge blocking layer 250 may be divided in two as illustrated in FIG. 8. Therefore, a portion of the fin shaped active region 130 may be exposed by the second opening groove 451.

Figure 9:
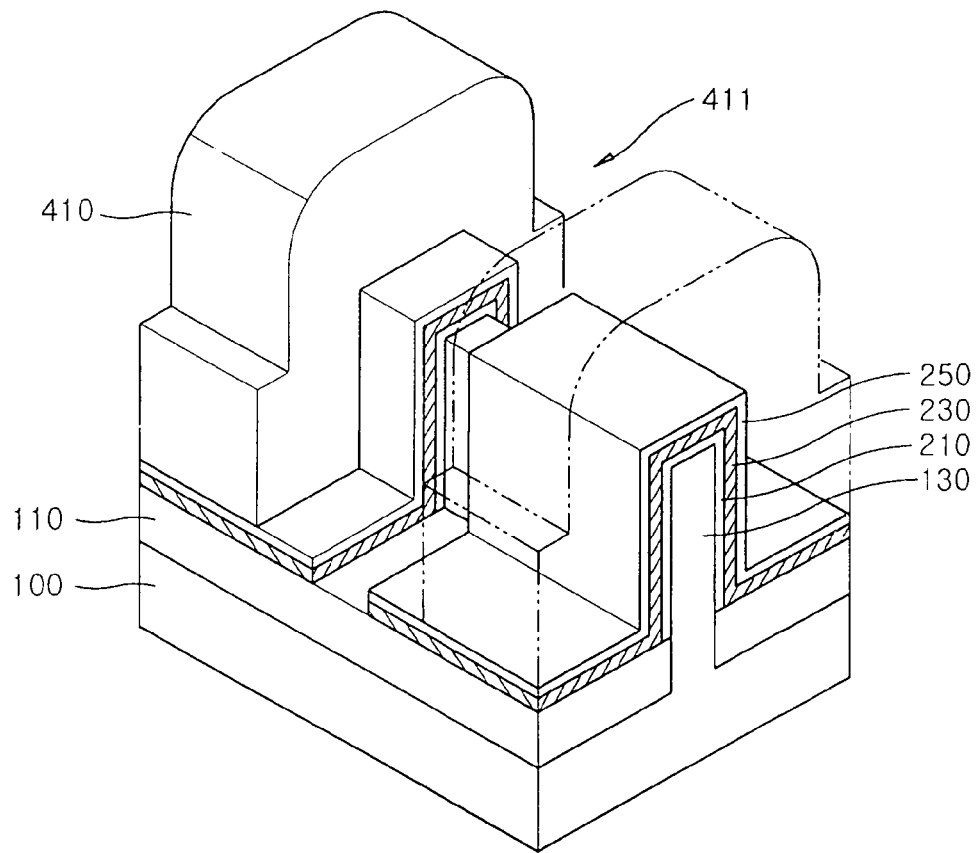

Referring to FIG. 9, the second sacrificial layer patterns 450 may be selectively removed. As a result, side surfaces of the divided stacked structure of the tunneling dielectric layer 210, the charge storage layer 230 and the charge blocking layer 250 may be exposed by the first opening groove 411 of the first sacrificial layer pattern 410. Also, an extended portion of the stacked structure of the tunneling dielectric layer 210, the charge storage layer 230 and the charge blocking layer 250 may be exposed by the first opening groove 411.

Figure 10:
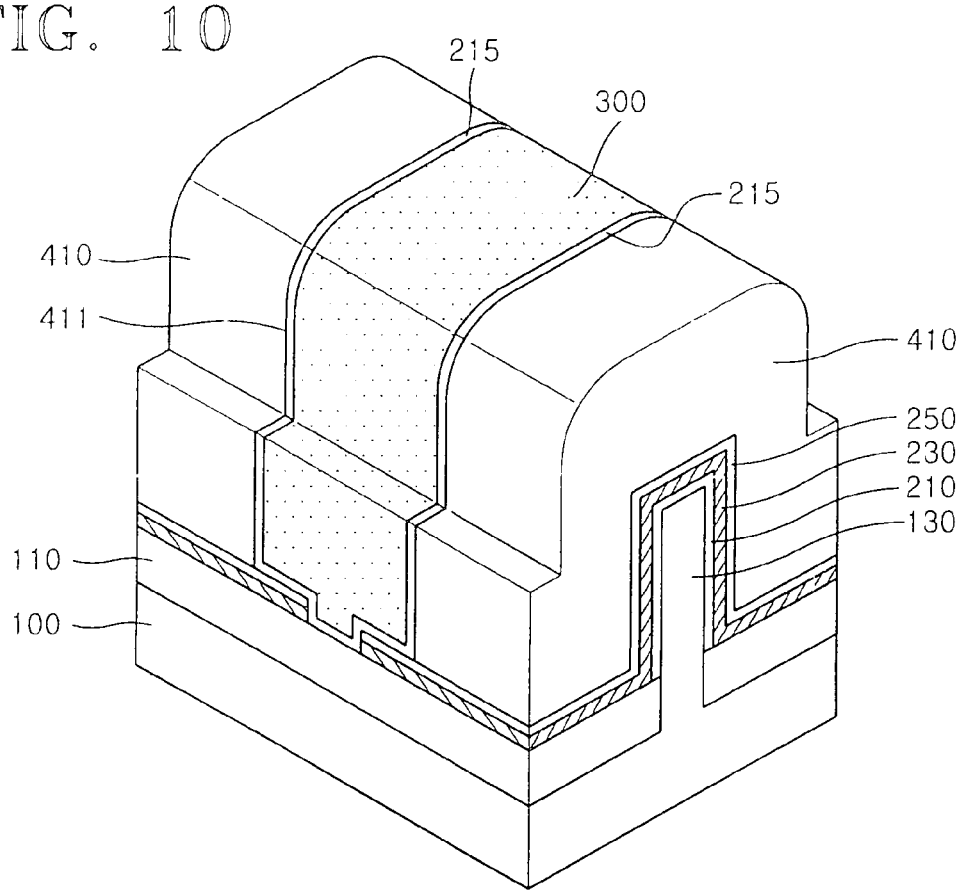

Referring to FIG. 10, a first gate dielectric layer 215 may be formed to cover the potion of the active region 130 exposed by the first opening grove 411. The first gate dielectric layer 215 may be formed using an oxidization process or by depositing an oxide material as illustrated in FIG. 3. The first gate dielectric layer 215 may be formed of silicon oxide by thermal oxidization or a depositing process.

Such a first dielectric layer 215 is formed to cover the portion of the active region 130 exposed by the first opening groove 411. Also, the first dielectric layer 215 may be extended to cover the exposed side surfaces of the divided stacked structure of the tunneling dielectric layer 210, the charge storage layer 230 and the charge blocking layer 250. Also, the first gate dielectric layer 215 may be extended to cover side surfaces of the first sacrificial layer pattern 410.

Then, a gate 300 may be formed on the first dielectric layer 215 to fill the first opening groove 411. For example, a conductive material, i.e., a conductive poly silicon layer, may be deposited to fill the first opening groove 410 and the gate 300 may be formed by etching back the conducive poly silicon layer to expose the top surface thereof. Therefore, the gate 300 may be formed to cover the first gate dielectric layer 215 above the divided charge storage layers 230.

Figure 11:
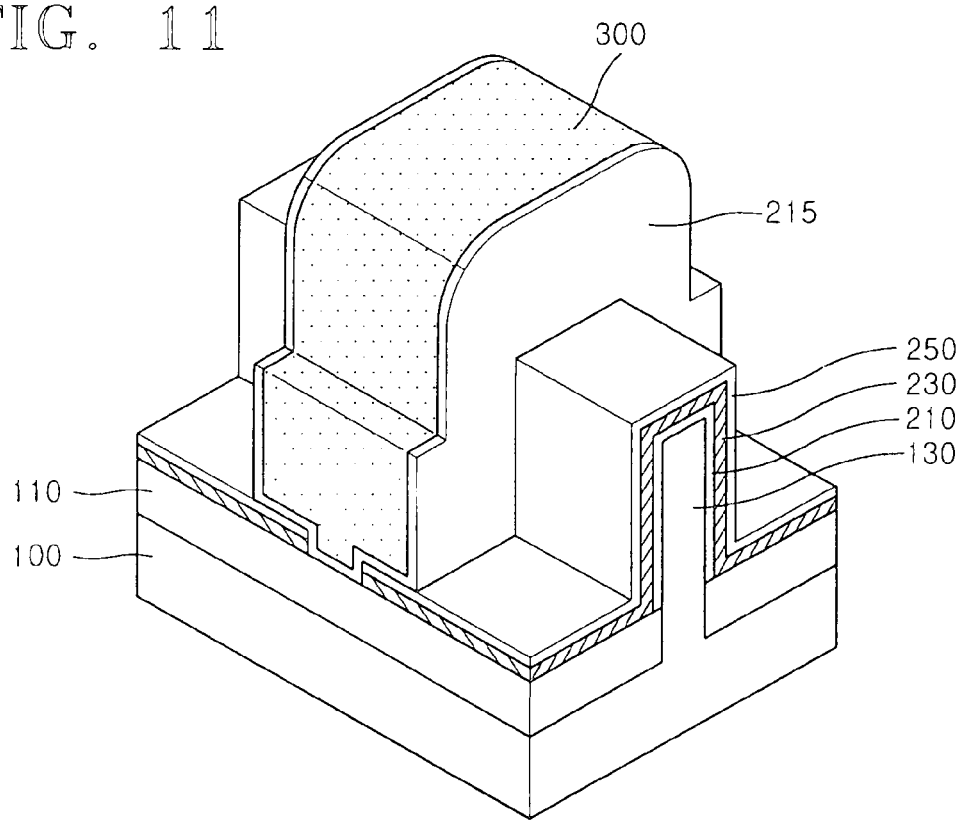

Referring to FIG. 11, the first sacrificial layer pattern 410 may be selectively removed. Therefore, a portion of the charge blocking layer 250, which was covered by the first sacrificial layer patter 410, may be exposed.

Then, the exposed portion of the charge blocking layer 250, portions of the charge storage layer 230 and the tunneling dielectric layer 210 under the exposed portion of the charge blocking layer 250 may be continuously removed using the gate 300 as an etch mask. As a result, local patterns of the charge storage layer 230, which are symmetrically and physically isolated from one another, are arranged under the gate 300 as illustrated in FIGS. 1A and 1B.

A source region and drain region (131 of FIG. 1A) are formed on both sides of the gate 300 using a source/drain forming process such as an impurity doping process.

The local charge storage layer patterns 230 may be patterned to be substantially aligned along the spacer shaped second sacrificial layer 450 illustrated in FIG. 8, and to be substantially aligned along an outline of an outer side surface of the gate 300. Since the two spacer shaped second sacrificial layer patterns 450 are formed by spacer etch process, they have the same line width. Therefore, the two charge storage layer patterns 230 may be formed to have substantially equivalent line width to each other and to have a substantially symmetrical structure.

Such local charge storage patterns 230 may have equivalent states to each other. Accordingly, the state of the charge stored in both of the local charge storage patterns 230 may be substantially equivalent. Also, as illustrated in FIGS. 11, 1A and 1B, the local charge storage layer patterns 230 may be physically isolated by the first gate dielectric layer 215. Therefore, signal interference effects such as cross-talking may drastically decrease. Also, a short channel effect may be prevented since the active region 130 has a fin structure with wide channel length. Therefore, the nonvolatile memory device according to the current embodiment of the present invention can provide a reliable performance for 2-bit operation.

The forming of the gate 300 of the present invention may be modified. Hereinafter, an operation of forming a gate according to another embodiment of the present invention will be described with reference to FIGS. 12 through 16, wherein like reference numerals denote like elements in FIGS. 1 through 16.

FIGS. 12 through 16 are perspective views for describing a method of fabricating a nonvolatile memory device according to another embodiment of the present invention.

Figure 12:
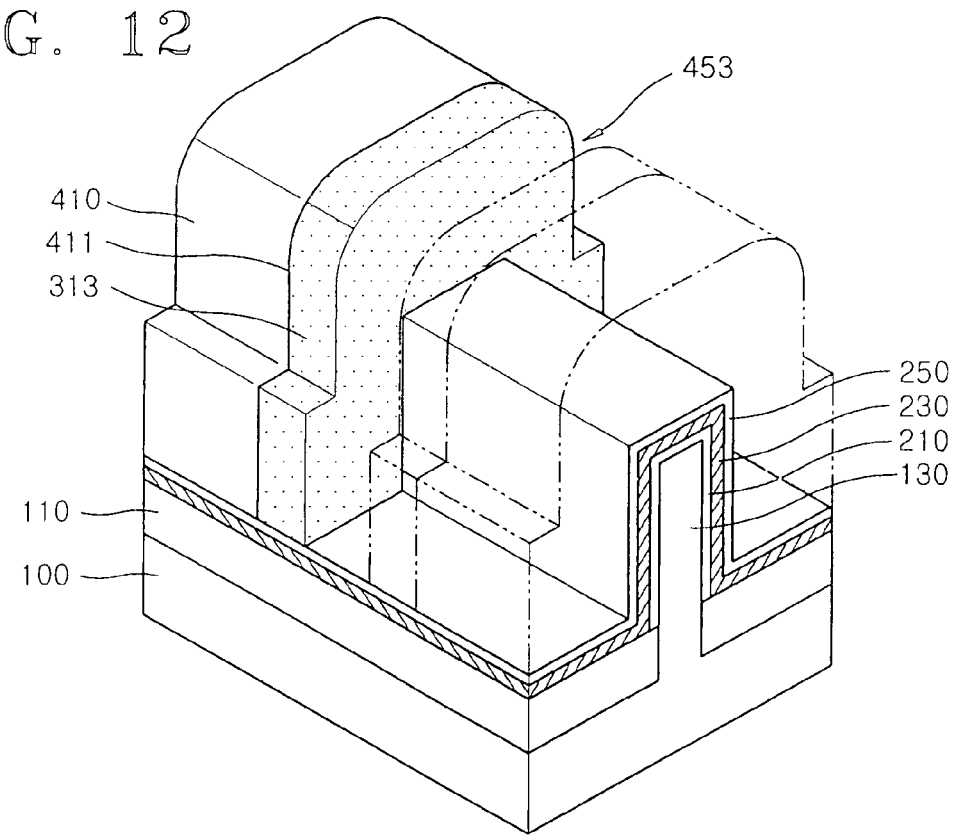
FIGS. 12 through 16 are schematic perspective views illustrating a method of fabricating a nonvolatile memory device according to another embodiment of the present invention.

Referring to FIG. 12, a first sacrificial layer pattern 410 may be formed using the method described with reference to FIGS. 2 through 6. After forming the first sacrificial layer pattern 410, first gates 313 having spacer shapes are formed on inner side surfaces of a first opening groove 411. The first gates 313 are formed of a conductive material including a conductive poly silicon layer, that has an etch selectivity different from the first sacrificial layer pattern 410.

The first gates 313 are formed by forming a conductive layer to cover the first sacrificial layer pattern 410 and the exposed charge blocking layer 250 and performing a spacer etch process of the conductive layer such as an anisotropic etch back process. Therefore, spacer shaped first gates 313 are formed on both inner side surfaces of the first sacrificial layer pattern 410 to face each other.

The two first gates 313 may be have a same line width through the spacer etch process.

Since the first gates 313 are formed on the side surfaces of the first opening groove 411, a third opening groove 453 has a narrower width. The charge storage layer 250 is partially exposed by the third opening groove 453.

Figure 13:
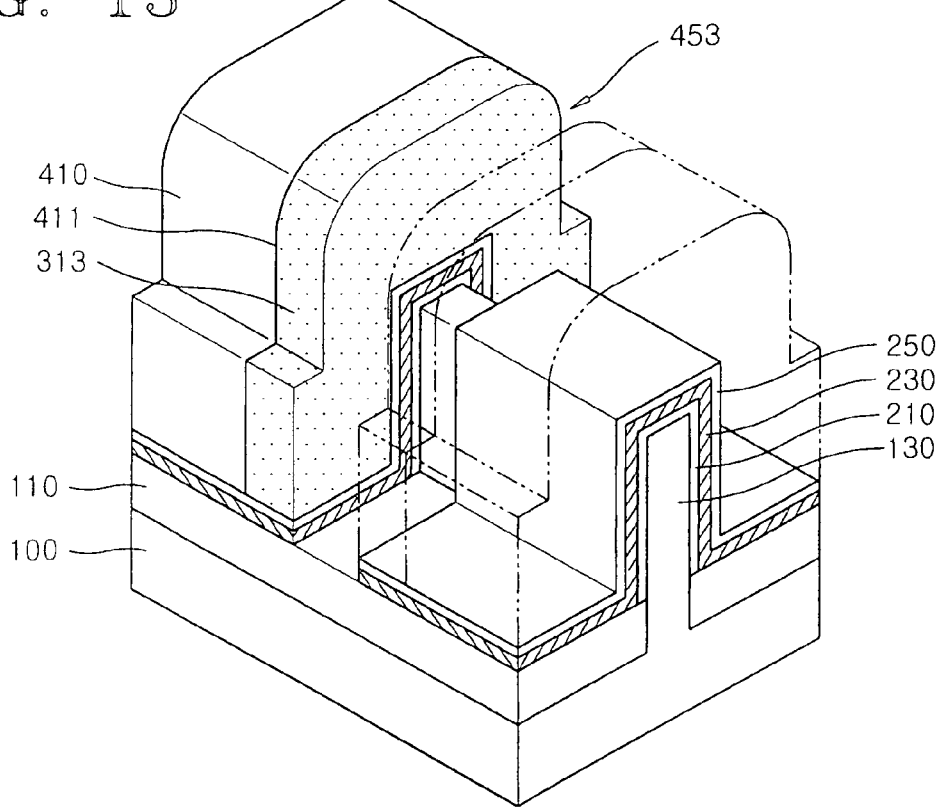

Referring to FIG. 13, the exposed portion of the charge storage layer 250, portions of the charge storage layer 230 and the tunneling dielectric layer 210 under the removed portion of the charge storage layer 250 may be selectively etched using the first sacrificial layer pattern 410 and the first gates 313 as an etch mask. Therefore, the stacked structure of the tunneling dielectric layer 210, the charge storage layer 230 and the charge blocking layer 250 may be divided in two. Therefore, a portion of the fin shaped active region 130 may be exposed by the third opening groove 453.

Figure 14:
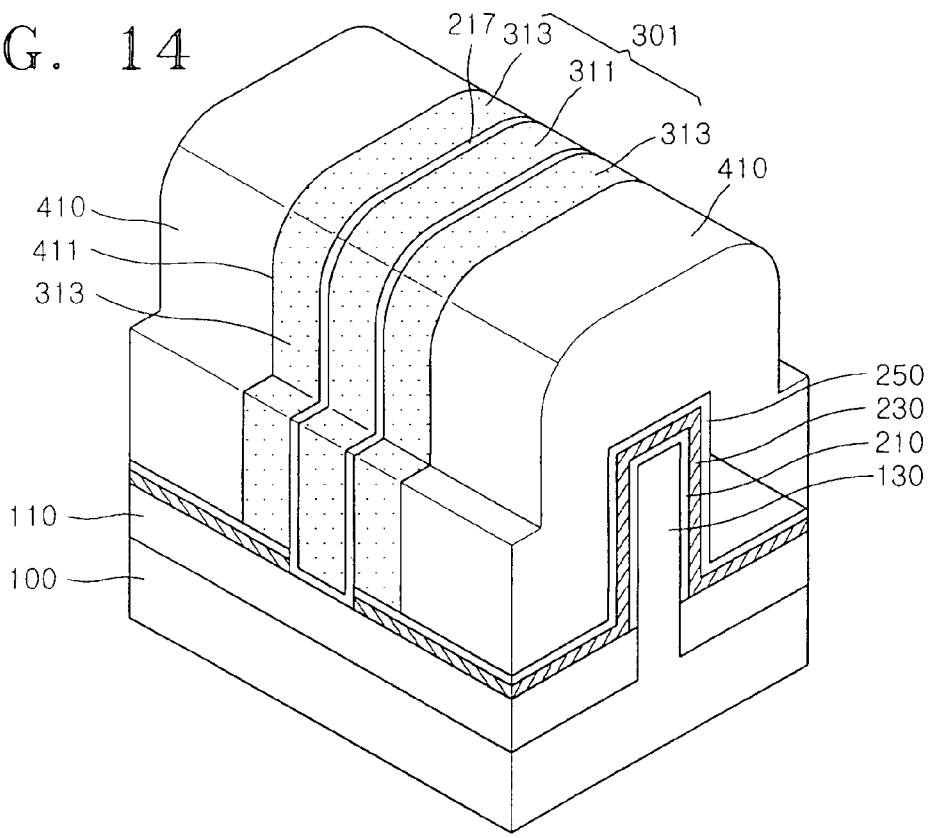

Referring to FIG. 14, a second gate dielectric layer 217 may be formed to cover the exposed portion of the active region 130 through the third opening groove 453 of FIG. 13. Such a second gate dielectric layer 217 may be formed through oxidizing the stacking structure illustrated in FIG. 13 or by depositing an oxide material. The second gate dielectric layer 217 may be formed by oxidizing silicon at a high temperature or by depositing silicon oxide.

The second gate dielectric layer 217 may be formed to cover the portion of the active region 130 exposed by the third opening groove 453, or may be extended to cover the exposed side surfaces of the divided stacked structure of the tunneling dielectric layer 210, the charge storage layer 230 and the charge blocking layer 250. Also, the second gate dielectric layer 217 may be further extended to cover side surfaces of the first gates 313.

Then, a second gate 311 may be formed on the first gate dielectric layer 217 to fill the third opening groove 453. For example, a conductive material including a conductive poly silicon layer may be deposited to fill the third opening groove 453. Then, the second gate 311 may be formed using an etch back process to expose a too surface of the first sacrificial layer pattern 410. As a result, the second gate 311 may be formed to cover the second gate dielectric layer 217, and the first gates 313 may be formed above the divided charge storage layers 230, respectively.

Figure 15:
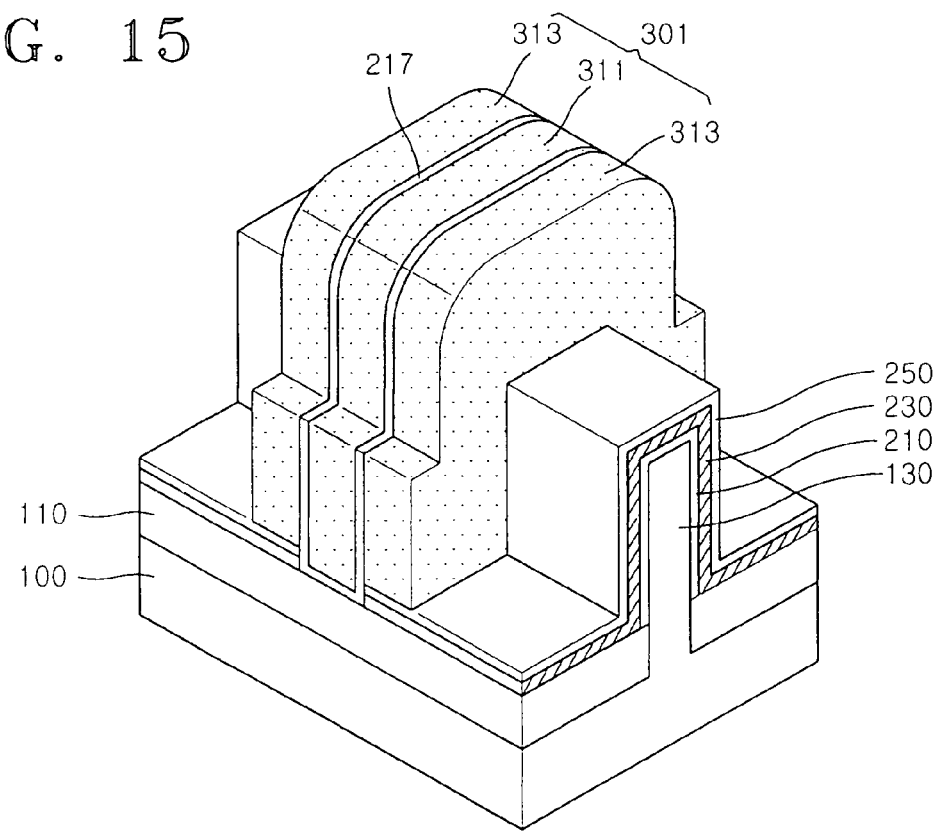

Referring to FIG. 15, the first sacrificial layer pattern 410 may be selectively removed. Therefore, the portion of the charge blocking layer 250, which was covered by the first sacrificial layer pattern 410, may be exposed.

Figure 16:
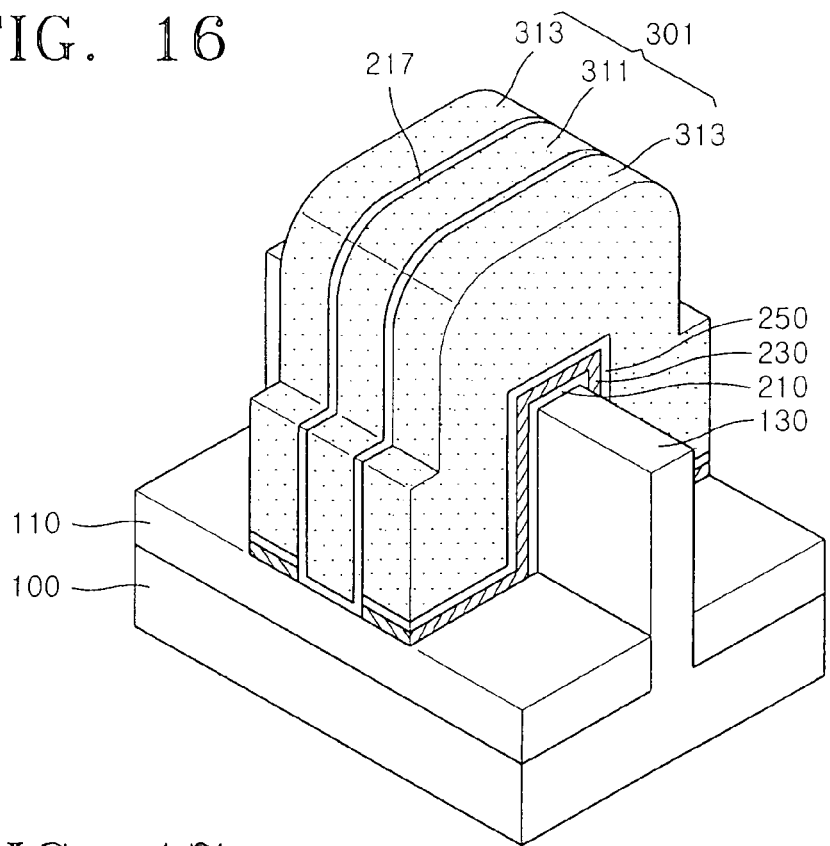

Referring to FIG. 16, the exposed portion of the charge blocking layer 250 may be selectively etched using the first and second gates 313, and 311 i.e. a gate 301, as the etch mask, and the portions of the charge storage layer 230 and the tunneling dielectric layer 210 under the removed portion of the charge blocking layer 250 may be continuously removed. Therefore, local patterns of the charge storage layer 230 may be physically and symmetrically isolated from each other and aligned under the gate 301. Then, a source and drain region may be formed on both sides of the gate 301 by performing a source/drain forming process such as implanting an impurity into the exposed portion of the active region 130.

The local charge storage layer patterns 230 may be formed to be aligned along the spacer shaped first gates 313 and to be aligned along an outline of an outer side surface of the second gate 311. Since the two spacer shaped first gates 313 may be formed using a spacer etch, they may have a substantially equivalent line width. Therefore, the two charge storage layer patterns 230, which are aligned along the first gates 313 and patterned, have an equivalent line width and have a symmetrical structure.

Therefore, the two local charge storage patterns 230 may have substantially equivalent states to each other. Accordingly, the state of the charges stored in both of the local charge storage patterns 230 may be equivalent. Also, as illustrated in FIG. 16, the local charge storage layer patterns 230 are physically isolated by the second gate dielectric layer 217. Therefore, signal interference effects such as cross-talking may drastically decrease. Also, a short channel effect may be prevented since the active region 130 has a fin structure with a wide channel length. Therefore, the nonvolatile memory device according to the current embodiment of the present invention can provide a reliable performance for 2-bit operation.

The formation of the gates 300 and 301 according to the described embodiments may be modified. Hereinafter, an operation of forming a gate according to another embodiment of the present invention will be described with reference to FIGS. 17 through 22, wherein like reference numerals denote like elements in FIGS. 1 through 22.

FIGS. 17 through 22 are schematic perspective views for describing a method of fabricating a nonvolatile memory device according to another embodiment of the present invention.

Figure 17:
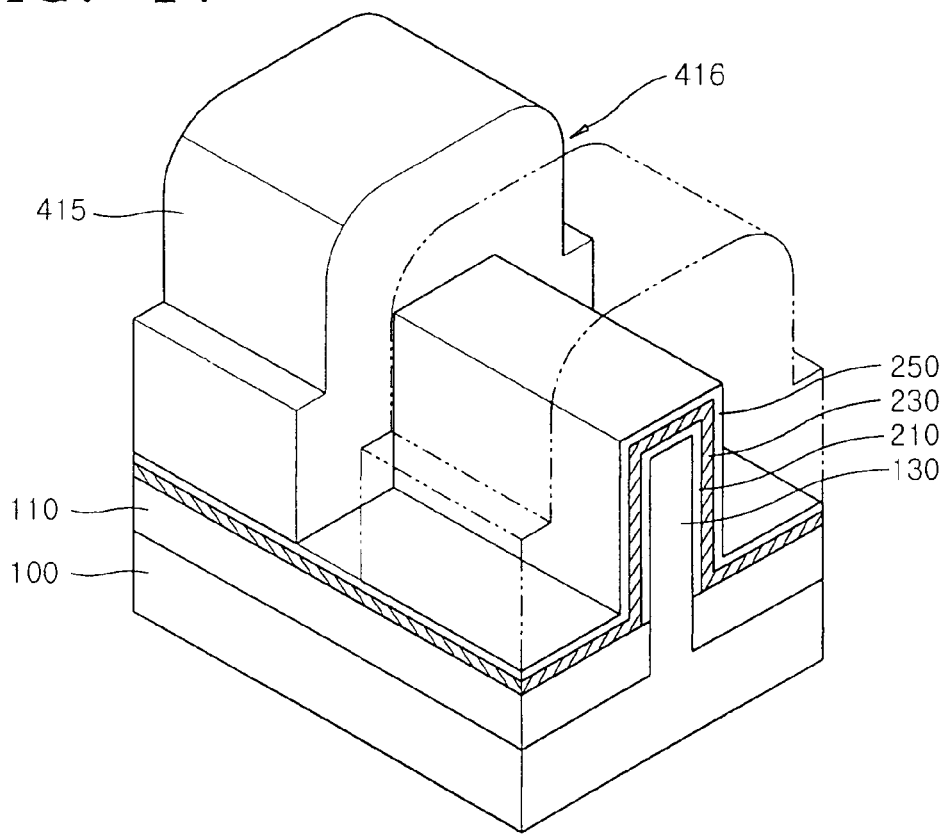
FIGS. 17 through 22 are schematic perspective views illustrating a method of fabricating a nonvolatile memory device according to another embodiment of the present invention.

Referring to FIG. 17, a stacked layer structure for storing charge may be formed on a semiconductor substrate 100 using method described with reference to FIGS. 1 through 5. That is, tunneling dielectric layer 210 may be formed to cover an active region 130 and a charge storage layer 230 is formed on the tunneling dielectric layer 210, as illustrated in FIG. 4. Then, the charge blocking layer 250 is formed on the charge storage layer 230. For example, an ONO or OSO stacking layer structure may be formed.

A third sacrificial layer pattern 415 may be formed as a frame to pattern a gate on the charge blocking layer 250. Herein, the third sacrificial layer pattern 415 may be formed using the same method of forming the first sacrificial layer pattern 410 illustrated in FIG. 6. Compared to the first sacrificial layer pattern 410, the third sacrificial layer pattern 415 may be patterned to have a fourth opening groove 416 and the fourth opening groove 416 may be formed to have a narrower line width than an entire line width of the gate.

The third sacrificial layer pattern 415 may be formed to have an insulating material including silicon nitride, having an etch selectivity different from an oxide layer forming the charge blocking layer 250 or a poly silicon layer forming the gate. Also, the third sacrificial layer pattern 415 may be formed of a silicon oxide material layer. In this case, the third sacrificial layer pattern 415 may be formed of an oxide material layer having a lower density than the oxide material layer of the charge blocking layer 250 to have a different etch selectivity.

Figure 18:
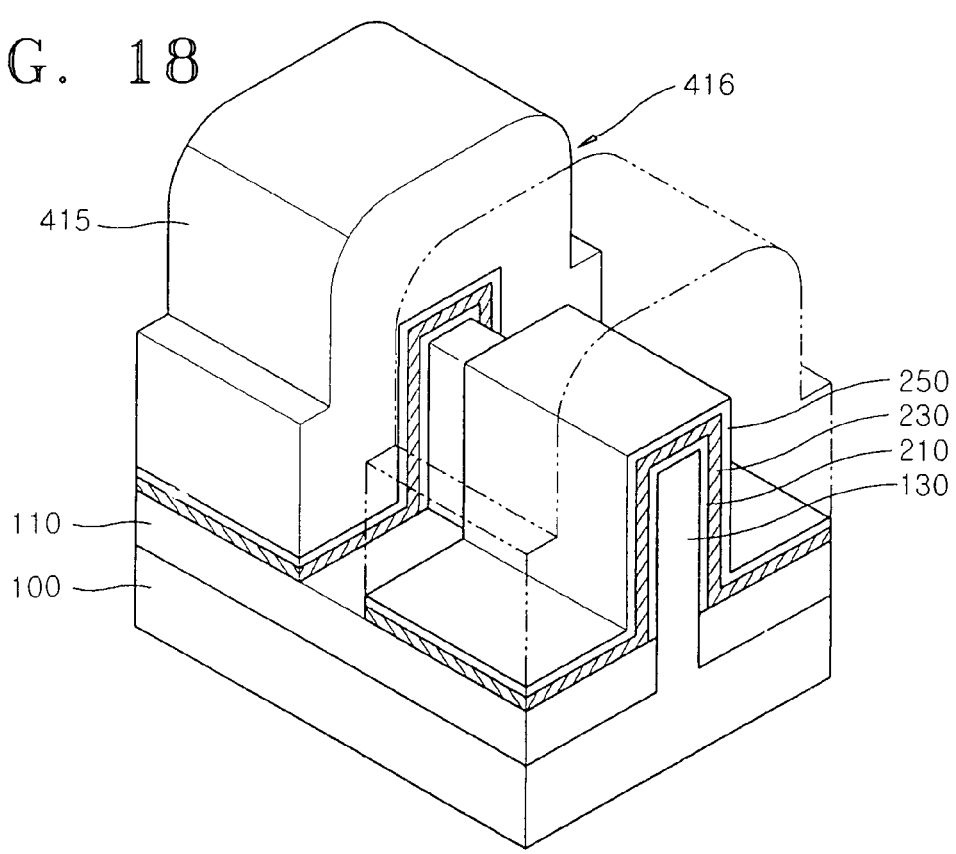

Referring to FIG. 18, after forming the third sacrificial layer pattern 415, the exposed portion of the charge blocking layer 250 may be selectively etched using the third sacrificial layer pattern 415 as the etch mask. Then, the portions of the charge storage layer 230 and the tunneling dielectric layer 210 under the etched portion of the charge blocking layer 250 may be selectively and continuously etched. Therefore, the stacking layer structure of the tunneling dielectric layer 210, the charge storage layer 230 and the charge blocking layer 250 may be divided into two. As a result, a portion of the active region 130 of the semiconductor substrate 100 may be exposed as illustrated in FIG. 18.

Figure 19:
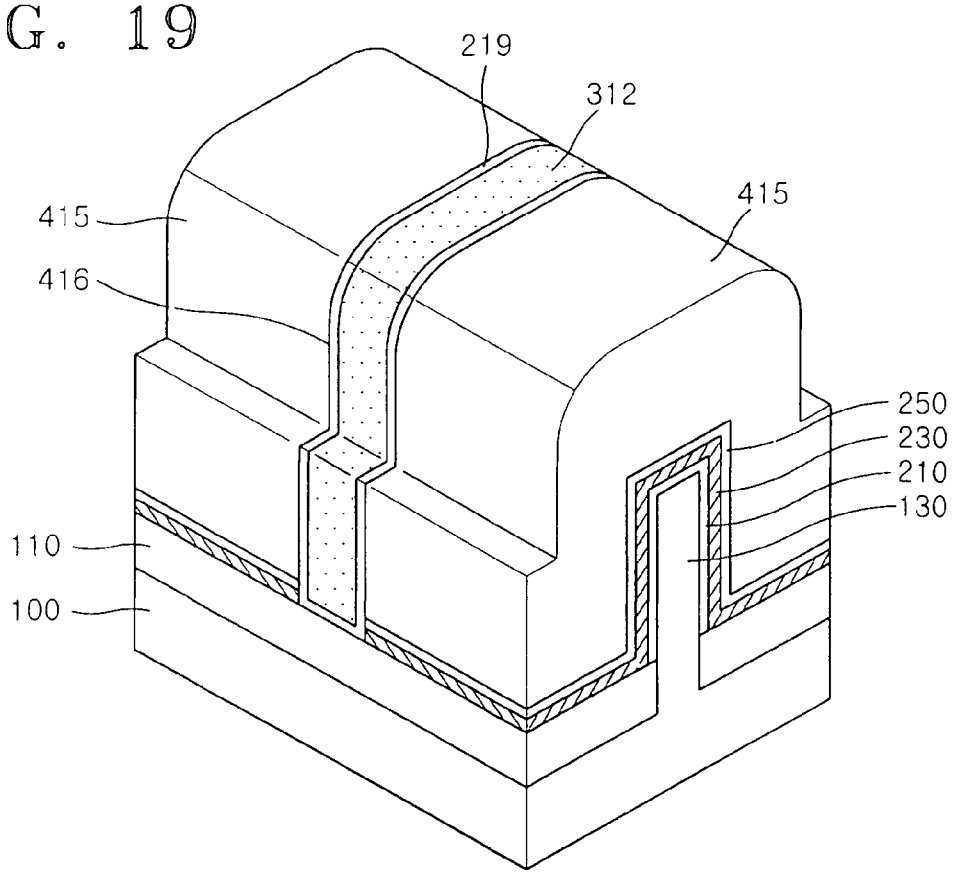

Referring to FIG. 19, a third gate dielectric layer 219 may be formed on the portion of the active region 130 exposed by the fourth opening groove 416 of the third sacrificial layer pattern 415. The third gate dielectric layer 219 may be interposed between a third gate 312 and the active region 130. The third gate dielectric layer 219 may be formed of silicon oxide, and may be extended to cover side surfaces of the third sacrificial layer pattern 415. Such a silicon oxide material layer may be formed using a deposition process such as CVD or by oxidizing at a high temperature.

A third gate 312 may be formed on the third gate dielectric layer 219 to fill the fourth opening groove 416. The third gate 312 may be formed using the method described with reference to FIG. 14. For example, the third gate 312 may be formed by filling the fourth opening groove 416 with a conductive layer, e.g., a conductive poly silicon layer and etching the conductive layer. The third gate 312 may be formed of a conductive material forming a gate of a transistor, e.g. conductive poly silicon, fully silicide layer or a metal layer.

Figure 20:
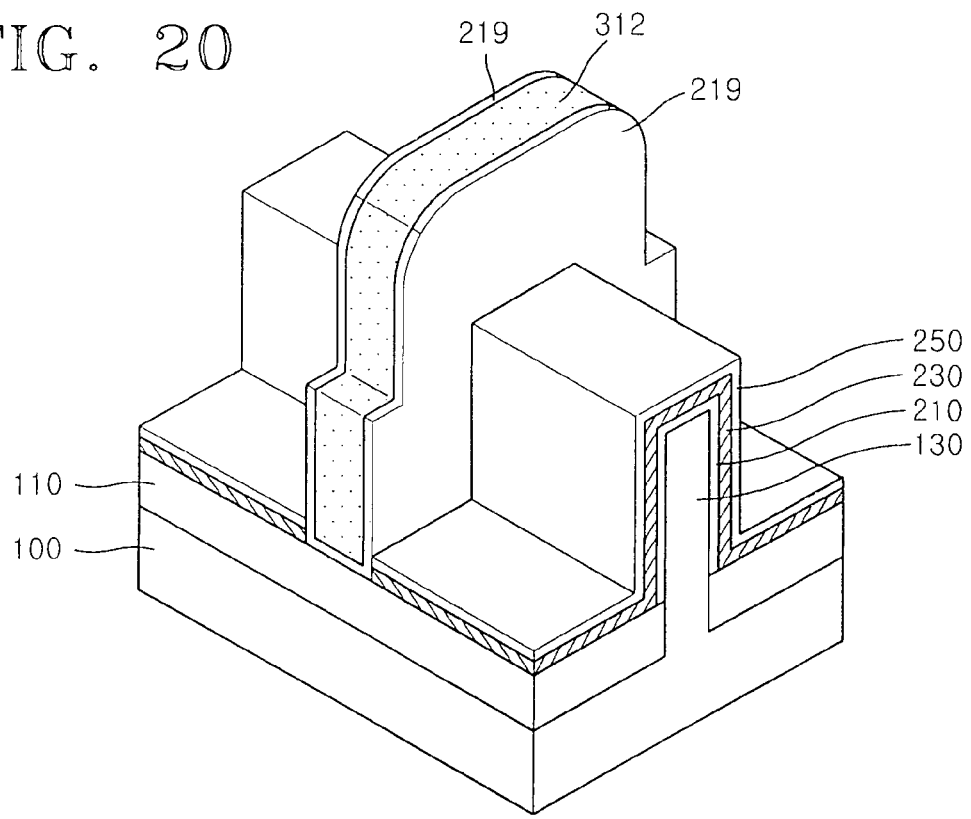

Referring to FIG. 20, the third sacrificial layer pattern 415 may be selectively removed after forming the third gate 312. Therefore, the top surface of the charge blocking layer 250, which was covered by the third sacrificial layer pattern 415, may be exposed.

Figure 21:
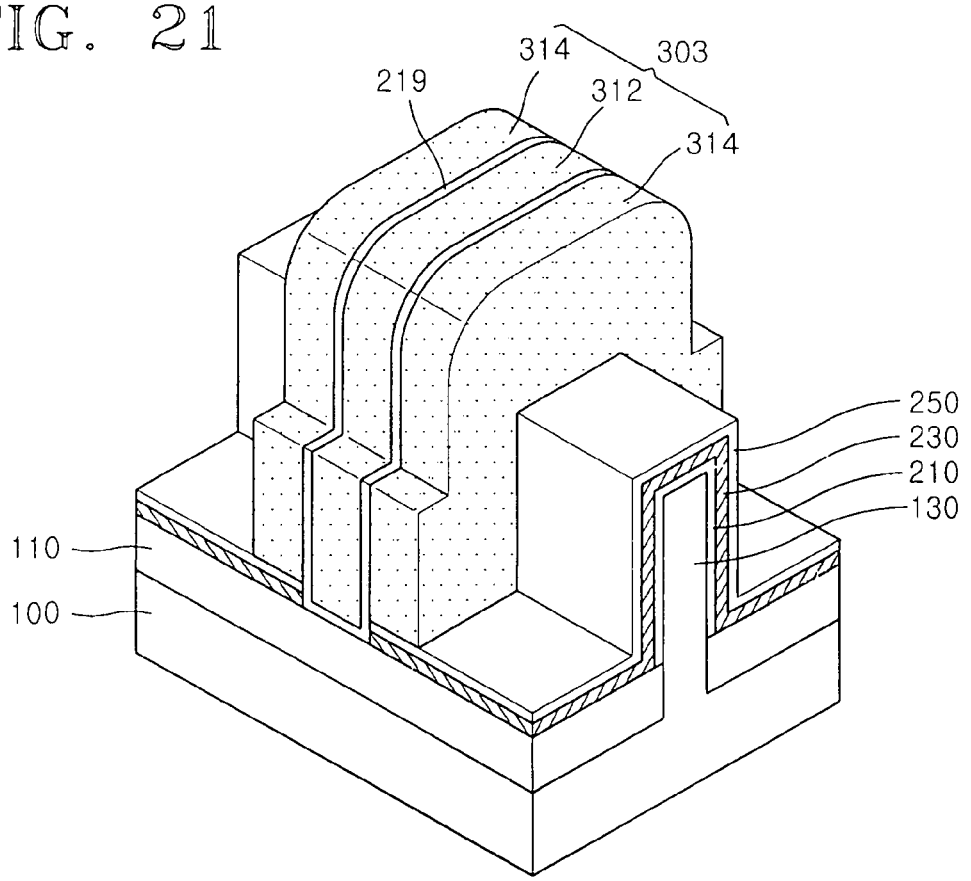

Referring to FIG. 21, fourth gates 314 may be formed in a spacer shape on side surfaces of the third gate electric layer 219 that may be exposed by removing the third sacrificial layer pattern 415. For example, a conductive layer formed of a poly silicon, a silicide or a metal, may be formed, and an entire anisotropic etch such as a spacer etch may be performed for forming the spacer shaped fourth gates 314 on both side surfaces of the third gate 312. Therefore, a gate 303 including the third and fourth gates 312, 314 may be completely formed.

Figure 22:
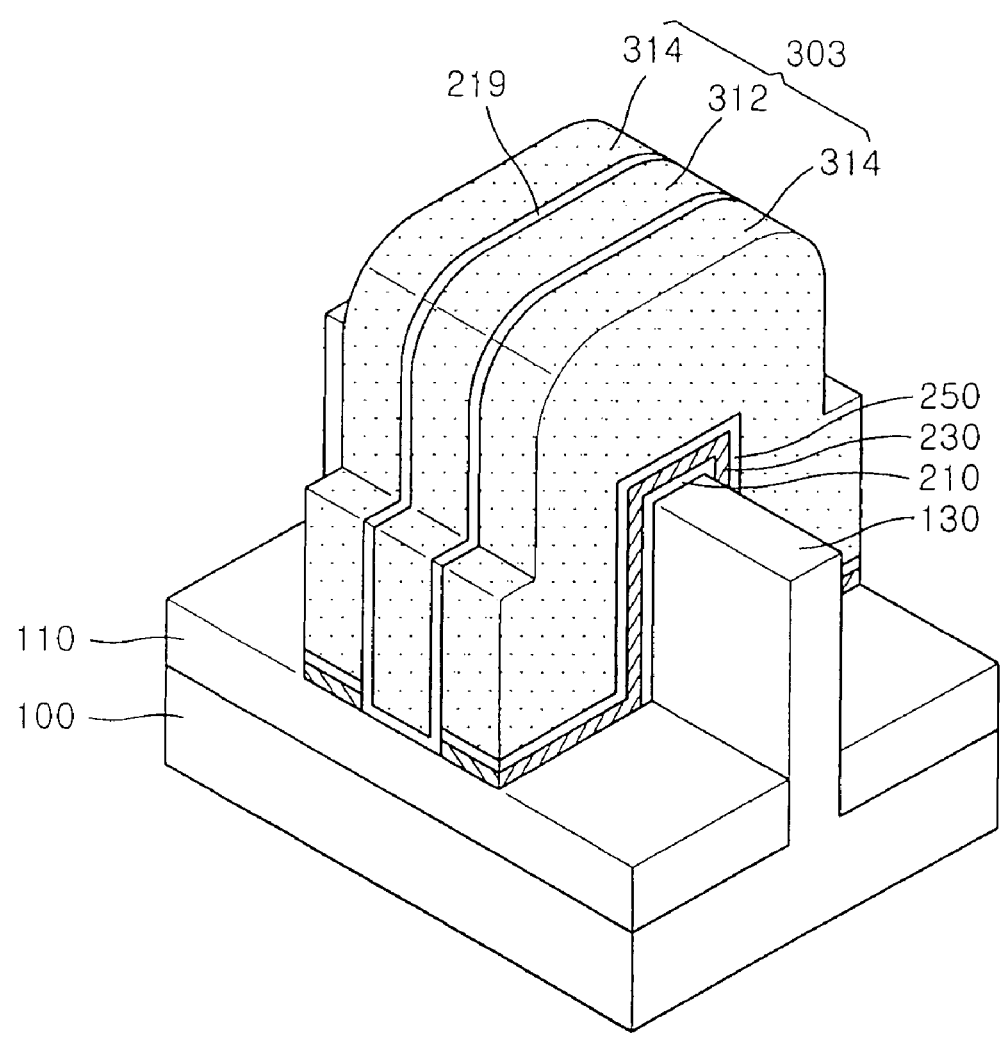

Referring to FIG. 22, the exposed portions of the charge blocking layer 250, which are externally exposed to both sides of the gate 303, may be removed using the gate 303 as the etch mask. Also, portions of the charge storage layer 230 and the tunneling dielectric layer 210 under the removed portions of the charge blocking layer 250 may be continuously and selectively removed.

Therefore, local patterns of the charge storage layer 230 may be formed under the fourth gates 314 by locally and physically isolating the charge storage layer 230 by the third gate 312 and the third gate dielectric layer 219. The local charge storage layer patterns 230 may be symmetrically formed and physically isolated from each other. Therefore, the charge stored in each of the local charge storage layer patterns 230 do not influence the charge stored in the other local charge storage layer patterns 230.

Like the patterning of the charge storage layer patterns 230, the charge blocking layer 250 and the tunneling dielectric layer 210 may also be patterned to be locally aligned along the fourth gate pattern 314.

After patterning the charge storage layer patterns 230, a source region and a drain region may be formed in the exposed portion of the active region 130 adjacent to the gate 303 using an impurity ion implantation process using the gate 303 as an ion implantation mask.

Each of the local charge storage layer patterns 230 can store charge. Therefore, each of the local charge storage layer patterns 230 can be thought as a storage node storing a bit signal. Also, the nonvolatile memory device according to the present invention can store four different states using forward read/write operations and reverse read/write operations. Therefore, the nonvolatile memory device according to the present invention can perform 2-bit operations.

According to embodiments of the present invention, the charge storage layer patterns can be embodied in a FinFET structure as storage nodes which may be physically isolated and symmetrically aligned. Therefore, a reliable transistor having no short channel effect can be implemented.

Also, a charge storage layer or a storage node can be locally isolated at both side regions under the gate in a transistor constructing a cell of a nonvolatile memory device according to an embodiment of the present invention. Therefore, disturbance of two-bit operations due to overlapped charge distributions in the charge storage layer is prevented. That is, since a cell transistor having storage nodes physically isolated under one word line can be embodied according to the present invention, the charge interference between bits inside the cell can be restrained. Therefore, the limitation of integrity of the memory device due to the charge interference effect can be overcome. Accordingly, the integrity of the memory device can be increased.

Furthermore, the gate dielectric layer may be interposed between the gate and the active region between two local charge storage patterns, and the charge storage layer may not be extended thereto according to an embodiment of the present invention. Also, the gate may be extended on the local charge storage patterns. Therefore, gate controllability may be improved, which influences the program charge density when programming operations are performed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nonvolatile memory device comprising:
   a fin type active region formed on a semiconductor substrate, a portion of the fin type active region protruding from the semiconductor substrate, the protruding portion of the fin type active region comprising a first side surface, a second side surface, and a top surface;
   a gate formed along the first side surface, the top surface, and the second side surface of the fin type active region;
   a pair of local charge storage layer patterns formed under the gate, and physically isolated from each other by an extending portion of the gate that extends from at least one of the first side surface and the second side surface of the fin type active region, wherein the pair of local charge storage layer patterns extends along the first side surface, the top surface, and the second side surface of the protruding fin type active region;
   a charge blocking layer interposed between the local charge storage patterns and the gate;
   a tunneling dielectric layer interposed between the local charge storage layer patterns and the active region for charge tunneling; and a gate dielectric layer extending between a side surface of the local charge storage layer pattern and the gate by being between the portion of the fin type active region protruding from the semiconductor substrate and the extending portion of the gate.

2. The nonvolatile memory device of claim 1, wherein the gate comprises:
a first gate aligned on the portion of the active region between the two physically isolated local charge storage patterns; and
two second gates each of which is aligned on each of the two physically isolated local charge storage patterns, respectively.

3. The nonvolatile memory device of claim 2, wherein the second gates are formed on side surfaces of the first gate in a spacer shape so as to have the same line width.

4. The nonvolatile memory device of claim 2, wherein the gate dielectric layer is further extended between the first gate and the second gates.

5. The nonvolatile memory device of claim 1, wherein the gate dielectric layer is further extended between the charge blocking layer and the gate.

6. The nonvolatile memory device of claim 1, wherein the charge storage layer comprises a silicon nitride material layer, and each of the charge blocking layer and the tunneling dielectric layer comprises a silicon oxide material layer so as to form a stacked structure of oxide-nitride-oxide (ONO).

7. A nonvolatile memory device comprising:
a fin type active region formed on a semiconductor substrate, the fin type active region comprising a first side surface, a second side surface, and a top surface;
a gate formed along the first side surface, the top surface, and the second side surface of the fin type active region;
a pair of local charge storage layer patterns formed under the gate, and physically isolated from each other by an extending portion of the gate that extends from at least one of the first side surface and the second side surface of the fin type active region, wherein the pair of local charge storage layer patterns extends along the first side surface, the top surface, and the second side surface of the fin type active region;
a charge blocking layer interposed between the local charge storage patterns and the gate;
a tunneling dielectric layer interposed between the local charge storage layer patterns and the active region for charge tunneling; and
a gate dielectric layer extending between side surfaces of the local charge storage layer pattern and the gate by being formed between the active region and the extending portion of the gate, wherein the gate dielectric layer is further extended between the charge blocking layer and the gate.

8. A nonvolatile memory device comprising:
a fin type active region formed on a semiconductor substrate, the fin type active region comprising a first side surface, a second side surface, and a top surface;
a gate formed along the first side surface, the top surface, and the second side surface of the fin type active region;
multiple dielectric layers spaced apart from each other between the fin type active region and the gate, the multiple dielectric layers comprising local charge storage layer patterns that extend along the first side surface, the top surface, and the second side surface of the fin type active region, a charge blocking layer interposed between the local charge storage layer patterns and the gate, and a tunneling dielectric layer interposed between the local charge storage layer patterns and the active region; and
a first gate dielectric layer extending between the gate and the active region unoverlapped by the multiple dielectric layers, wherein the local charge storage layer patterns are physically isolated from each other by the first gate dielectric layer.

9. The nonvolatile memory device of claim 8, wherein the gate comprises:
a first gate aligned on the active region unoverlapped by the multiple dielectric layers; and
two second gates, each of which is aligned on each of the multiple dielectric layers.

10. The nonvolatile memory device of claim 9, wherein the first gate dielectric layer extends between the first gate and each of the two second gates.

* * * * *